United States Patent

Engbert

[15] 3,639,814

[45] Feb. 1, 1972

[54] INTEGRATED SEMICONDUCTOR CIRCUIT HAVING INCREASED BARRIER LAYER CAPACITANCE

[72] Inventor: Reiner Engbert, Talheim, Germany

[73] Assignee: Telefunken Patentverwertungsgesellschaft m.b.H., Ulm (Danube), Germany

[22] Filed: May 20, 1968

[21] Appl. No.: 730,284

[30] Foreign Application Priority Data

May 24, 1967 Germany ..............................T 33,927

[52] U.S. Cl.......................317/235 R, 317/234 U, 317/235 E

[51] Int. Cl...........................................................H01l 19/00

[58] Field of Search..........................................317/237, 235

[56] References Cited

UNITED STATES PATENTS

| | | | |
|---|---|---|---|
| 3,456,166 | 7/1969 | Welty | 317/234 |
| 3,538,397 | 11/1970 | Davis | 317/235 |
| 3,411,052 | 11/1968 | Lauffer et al. | 317/235 |
| 3,441,815 | 4/1969 | Pollock et al. | 317/235 |
| 3,460,010 | 8/1969 | Domenico et al | 317/235 |

*Primary Examiner*—Jerry D. Craig
*Attorney*—Spencer & Kaye

[57] ABSTRACT

An integrated semiconductor circuit having semiconductor regions isolated from each other by separation barrier layers and semiconductor devices inserted in these regions, the separation barrier layers being configured to have an increased capacitance which is used to stabilize the supply voltage.

4 Claims, 7 Drawing Figures

Inventor:
Reiner Engbert
By: Spencer & Kaye
Attorneys

Inventor:
Reiner Engbert
By: Spencer & Kaye
Attorneys

Inventor:
Reiner Engbert
By: Spencer & Kaye
Attorneys

INTEGRATED SEMICONDUCTOR CIRCUIT HAVING INCREASED BARRIER LAYER CAPACITANCE

BACKGROUND OF THE INVENTION

The present invention relates to an integrated semiconductor circuit having semiconductor regions into which semiconductor devices are inserted and which are isolated from each other by separation barrier layers.

In the construction of integrated semiconductor circuits, a P-conductive base element, for example, which is generally called a substrate, is epitaxially covered with an N-conductive layer whose impurity doping is usually heavier than that of the semiconductor base element. A framework of P-conductive zones into the N-conductive surface layer can then be diffused into this layer to leave isolated N-conductive semiconductor island regions which are surrounded, within the semiconductor element, by PN-junctions. Since these PN-junctions electrically insulate the electrical components to be inserted into each semiconductor island region from the components in the other island regions, these PN-junctions are generally called separation barrier layers. For the production of a given integrated circuit, those electrical components which are to be separated from each other electrically are subsequently inserted into adjacent semiconductor regions.

In most integrated circuits, which are essentially logic or amplifier circuits, the resistors for the circuit can be placed on one isolated semiconductor region in the form of diffused resistive strips whereas the diodes and transistors of the integrated semiconductor circuit are inserted into other semiconductor regions. The individual components of the integrated circuit are connected to each other at the semiconductor surface, in a manner determined by the circuit to be constructed, by means of metallic conductive paths. These conductive paths are separated from the semiconductor body by insulating layers, except at the contact points for the individual structural components. The resistors in the integrated circuit are often connected to the highest potential terminal of the supply voltage for the circuit whereas the substrate is placed at the lowest potential.

It has now been found that switching operations within the integrated circuit cause great resistance fluctuations and thus great changes in the currents flowing through the circuit. The strong fluctuations in current strength result in substantial variations in the load on the voltage source supplying the circuit, often leading to undesirable variations in the voltage ratio upon which the proper operation of the circuit depends.

SUMMARY OF THE INVENTION

It is a primary object of the present invention to eliminate these drawbacks.

A more specific object of the invention is to substantially reduce the supply current fluctuations resulting from switching operations in an integrated circuit.

A further object of the invention is to stabilize the operation of such an integrated circuit without increasing the overall dimensions of its isolated semiconductor regions.

In order to accomplish these objectives, the present invention proposes, for an integrated semiconductor circuit, that the components which determine the capacitance of one or a plurality of separation barrier layers be constructed so that the capacitance formed by the separation barrier layer(s) has a voltage-stabilizing effect.

A separation barrier layer should be constructed, first of all, in such a manner or with sufficiently large dimensions that a stabilization of the circuit supply voltage is achieved.

The separation barrier layer surrounding the semiconductor region containing the resistances of the integrated circuit can advantageously be utilized for this purpose by connecting the semiconductor region containing the resistors to one terminal of the supply voltage source and the semiconductor base element, or substrate, to the other voltage source terminal.

It has been found that the capacitance of the separation barrier layers in known integrated circuits is too small to produce a satisfactory voltage stabilization. The capacitance of the barrier layer adjacent the semiconductor region containing the resistors in a known type of integrated circuit is approximately 30 to 50 pf. An increase in this capacitance could be achieved by physically enlarging the semiconductor region containing the resistors, since this would result in an enlargement of the separation barrier layer area and thus an increase in the capacitance of this barrier layer. Such an enlargement of a semiconductor region in an integrated circuit, however, inevitably results in an enlargement of the semiconductor circuit dimensions and thus in a reduction in the number of integrated circuits which can be produced from a single semiconductor wafer. This would thus bring about increased production costs for integrated circuits.

The present invention is based on the realization that not all portions of the separation barrier layer contribute to the same extent to the capacitance value of this barrier layer. The capacitance of a PN-junction is always determined by the nature of that region bordering the barrier layer which has the highest resistivity since a space charge zone free of charge carriers in the vicinity of a barrier layer extends mainly into the region which is less heavily doped with impurities. The extent of the space charge zone determines the effective surface area of the barrier layer as well as its capacitance. In integrated semiconductor circuits, the semiconductor base element, or substrate, is generally very weakly doped to have a resistivity of approximately 10Ω-cm. The semiconductor regions intended for containing the individual electrical components are usually more heavily doped; their specific resistance is, for example, 1Ω-cm. The framework-type separation diffusion zones which separate the regions intended for carrying the electrical components of the circuit are the most heavily doped zones.

The present invention seeks to substantially increase the capacitance-determining portion of the separation barrier layer adjacent the separation diffusion zones without requiring a physical enlargement of the semiconductor region surrounded by the separation barrier layer, and thus without a physical enlargement of the overall integrated circuit.

This is achieved, according to the present invention, in an integrated semiconductor circuit having isolated semiconductor regions formed in a semiconductor substrate, each semiconductor region being bounded by a separation barrier layer which separates it from the other regions and each region being provided with a circuit component made of semiconductor material, by the improvement wherein that portion of a barrier layer which provides the greatest contribution to its capacitance is constructed for causing the capacitance of the barrier layer to be sufficiently large to be capable of stabilizing the supply voltage for the circuit.

DESCRIPTION OF THE PREFERRED EMBODIMENTS

Figure 1:
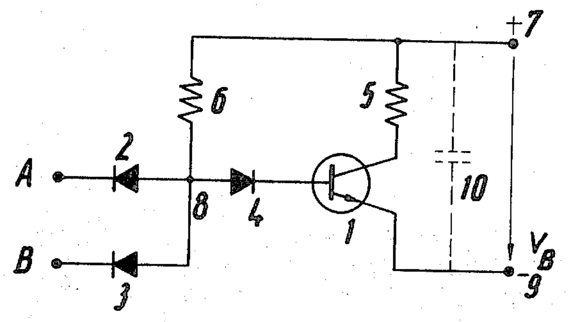
FIG. 1 is a circuit diagram of a semiconductor circuit which is to be produced in integrated form.

FIG. 1 shows a diode transistor logic circuit which forms a so-called NAND gate. In the data-processing art a NAND gate is understood to be a negated AND gate. This means that at the output of the circuit a binary zero will appear only when a binary 1 is applied to both inputs A and B. This is achieved in that the transistor 1 becomes conductive, and the collector-emitter path has a low resistance, only when a positive voltage is applied to both inputs A and B.

The circuit consists of a transistor 1, three diodes 2, 3 and 4 and two resistors 5 and 6. The diodes 2 and 3 are connected to inputs A and B of the circuit. Resistor 5 is connected to the collector of the transistor 1 and is in communication with the positive terminal 7 of the $V_B$ supply voltage source. The second resistor 6, which leads to a junction 8 formed by the diodes of the circuit, is also connected to the positive terminal of the supply voltage source. The emitter of the transistor is connected to the negative terminal 9 of the DC supply voltage. According to the invention, a capacitance 10 is to be provided between terminals 7 and 9 of the supply voltage source so as to be in parallel with the series branch consisting of the resistor 5 and the collector-emitter path of transistor 1.

Figure 2:
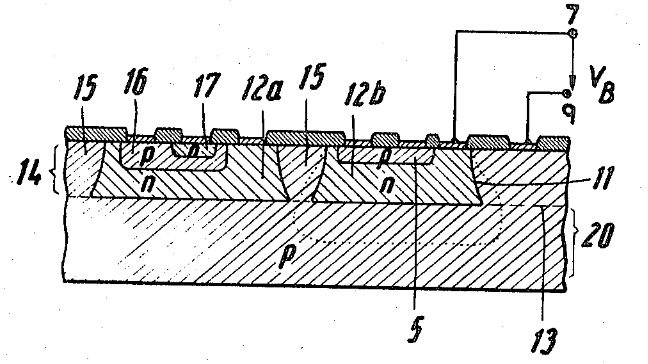
FIG. 2 is a cross-sectional view of a portion of such an integrated circuit.

The circuit of FIG. 1 may be realized by an integrated circuit, part of which is shown in cross section in FIG. 2. The capacitance 10 is realized, according to the invention, by the separation barrier layer 11 of the semiconductor region 12*b* intended to carry the resistors of the integrated circuit. The semiconductor arrangement of FIG. 2 consists, for example, of a weakly doped P-conductive substrate 20, which is bounded by the dashed line 13. On this base element there is disposed an N-conductive epitaxial layer 14 and portions of this layer are formed into isolated semiconductor regions, or islands, 12*a*, 12*b*, etc., by the diffusion into layer 14 of a framework of P-conductive separation zones 15.

The semiconductor regions 12*a*, 12*b*, etc., are more heavily doped than the substrate 20 while the separation diffusion zones 15 are in turn more heavily doped than the semiconductor regions 12*a*, 12*b*, etc.

In the semiconductor regions 12*a*, a transistor is formed, for example, by the diffusion therein of a P-conductive base zone 16 and the diffusion into the base zone of an N-type emitter zone 17, the region 12*a* serving as the transistor collector. Resistors 5 and 6 (FIG. 1) are diffused as P-type regions into the semiconductor region 12*b*. In other semiconductor regions not shown in FIG. 2 there are further structural components of the integrated circuit.

Around the semiconductor region 12*b* there is shown a dotted line indicating the extent of the space charge zone free of charge carriers which develops when a certain blocking voltage is present across the separation barrier layer 11. As can be seen in FIG. 2, the space charge zone between the semiconductor region 12*b* and the separation diffusion zone 15 is very small, i.e., the contribution to the capacitance of the barrier layer is particularly large at this location, whereas this contribution is very small in the barrier layer region between the base element 20 and the semiconductor region 12*b*.

To utilize the barrier layer capacitance for stabilizing the supply voltage, the semiconductor substrate 20 is connected to the negative terminal 9 of the voltage source via the separation diffusion zone 15, and the semiconductor region 12*b* in which the resistors of the circuit are disposed is connected to the positive terminal 7 of the voltage source for biassing the barrier layer 11 in its reverse, or blocking, direction. In FIG. 2, the connection of the individual circuit elements via conductive paths extending above the semiconductor surface is not shown, neither is the connection between one contact point of resistors 5 and 6 and the contact point for the supply voltage on the semiconductor region 12*b*.

Figure 3:
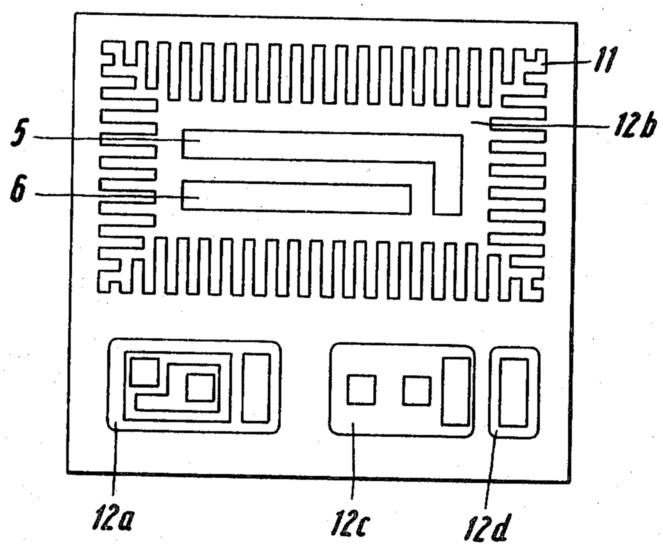
FIG. 3 is a plan view of an arrangement according to the invention having a separation barrier layer in meander form which surrounds the semiconductor region intended for the resistors of the integrated circuit.

FIG. 3 is a plan view of an integrated circuit and shows one way in which the capacitance of the separation barrier layer 11 is increased, according to the invention, by causing the portion of the barrier layer which extends to the semiconductor surface to follow a meandering path, i.e., to have a convoluted surface. This causes the area of the capacitance-determining portion of the barrier layer, and thus the capacitance itself, to be substantially increased. The resistors 5 and 6 of the integrated circuit are disposed within the semiconductor region 12*b* enclosed by the barrier layer in the form of P-conductive diffused zones, while transistor 1 is disposed in semiconductor region 12*a*, diodes 2 and 3 in semiconductor region 12*c* and diode 4 in semiconductor region 12*d*.

Figure 4:
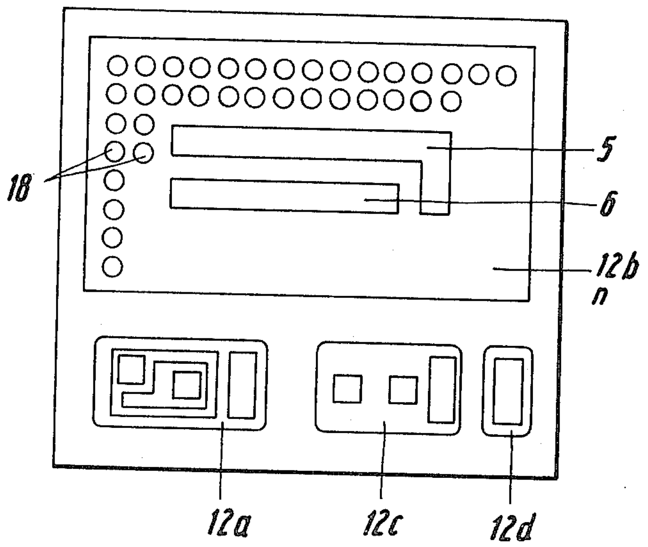
FIG. 4 is a view similar to that of FIG. 3 of another arrangement, according to the invention.
Figure 5:
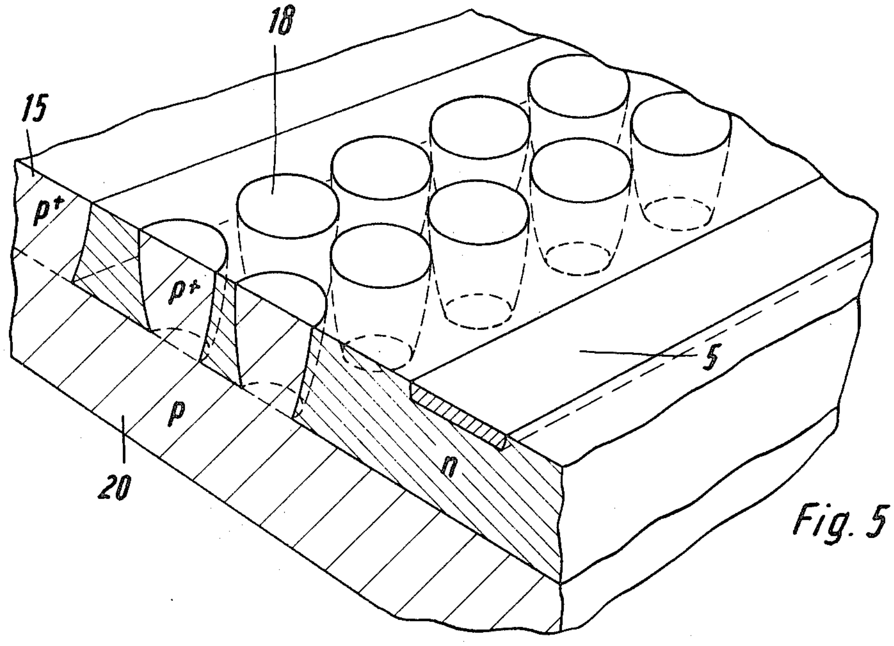
FIG. 5 is a cross-sectional, perspective view of a portion of the semiconductor region shown in FIG. 4 for the resistors of the integrated circuit.

FIG. 4 is a plan view which shows another manner of increasing the capacitance of barrier layer 11. For this purpose those portions of the N-conductive semiconductor region 12*b* which are not occupied by the diffused resistors 5 and 6 are provided with isolated diffused P-conductive zones 18 which extend entirely through region 12*b*. These zones 18 are advantageously very heavily doped, and thus have a low resistivity, so that the extent of the space charge zone remains very small when the barrier layer 11, whose effective surface has been greatly enlarged by the cylindrical zones 18, is biased in the blocking direction, and the capacitance of the barrier layer becomes very high.

It is most advantageous for the zones 18 to be doped to the same extent as separation diffusion zones 15 because this enables the above-mentioned zones to be produced by a single diffusion process. The isolated zones 18 can be constructed to be annular, rectangular, cylindrical, or to have any other desired shape. That shape which, based on experiments, results in the greatest increase in the effective area of the barrier layer 11 for the particular integrated circuit will be the preferred type.

Figure 6:
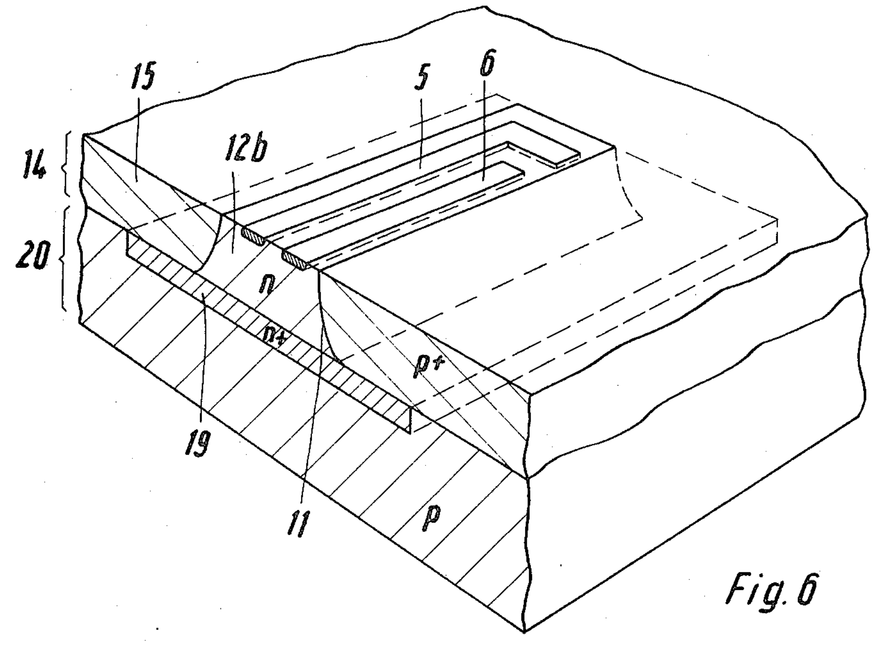
FIG. 6 is a view similar to that of FIG. 5 of another portion of the arrangement of FIG. 4 showing that semiconductor region intended for the resistors of the integrated circuits which borders on a buried layer.

FIG. 6 is a cross-sectional, perspective view of a completely different arrangement in which the doped layer 14 is shown as being transparent only to permit the shape of region 12*b* to be seen. This arrangement also leads to an increase in the capacitance of the barrier layer 11. FIG. 6 shows only that portion of the integrated circuit which contains the semiconductor region for the resistors 5 and 6.

To produce the semiconductor arrangement of FIG. 6, a flat $N^+$-doped zone 19 is diffused into the P-conductive base element 20 to form a "buried" layer. Then an N-conductive epitaxial layer 14 is deposited onto the semiconductor body and the buried layer, and a portion of layer 14 is formed into isolated semiconductor regions or islands (e.g., 12*b*) by the provision of $P^+$-conductive separation diffusion zones 15. The separation diffusion zones, however, must not penetrate into the buried layer 19 and must rather only border thereon.

The cross section of the semiconductor region 12*b*, in a plane parallel to the semiconductor surface, should be so selected, according to the invention, as to be smaller than the cross section of the buried layer directly adjacent thereto. Advantageously, the semiconductor region 12*b* is centered on the buried layer 19. Since the cross section of the heavily doped buried layer 19 is substantially greater than the cross section of the semiconductor region 12*b*, these cross sections being in a plane perpendicular to the length of region 12*b*, separation layer regions having a high capacitance result at those places where the separation diffusion zone 15 comes into contact with the semiconductor region 12*b* or with the buried layer 19.

Since the barrier layer 11 is contiguous with the barrier layer between the buried layer 19 and the separation diffusion zone 15, the barrier layer capacitance between these latter zones also contributes to the capacitance of the barrier layer 11.

Figure 7:
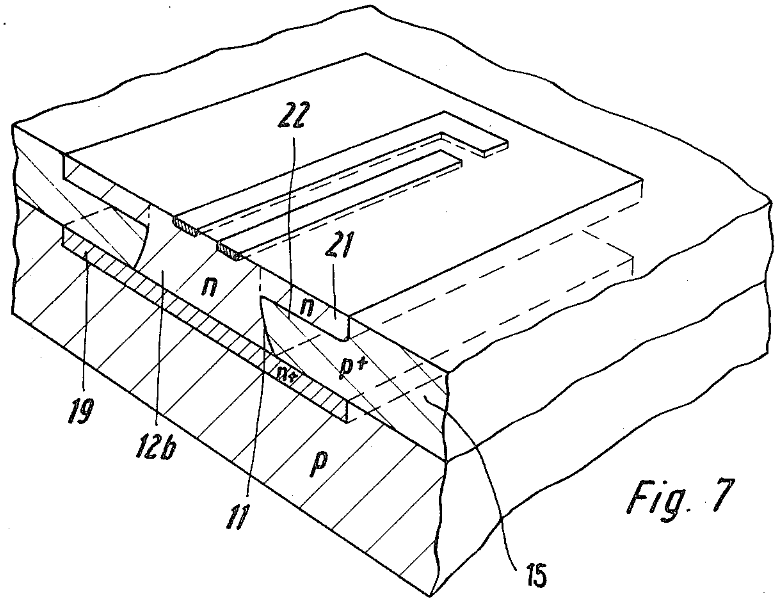
FIG. 7 is a view similar to that of FIG. 6 showing a modification of the arrangement shown in FIG. 6.

FIG. 7 is a view similar to that of FIG. 6 showing a modification of the arrangement according to FIG. 6. In this arrangement the semiconductor region 12*b*, whose cross section is smaller than that of the buried layer 19, is enlarged directly at its upper surface to have a cross section equal to the cross section of the buried layer, by a subsequently diffused N-conductive zone 21 having a shallow penetration depth. This causes the capacitance-determining portion of barrier layer 11 of the arrangement of FIG. 6 to be enlarged by a barrier layer portion 22 which extends between zone 21 and the separation diffusion zone 15. Thus a further increase in the capacitance can be achieved.

In the semiconductor arrangements shown in the exemplary embodiments, the barrier layer capacitance could be increased to approximately 300 to 500 pf., which corresponds to an approximately 10-fold increase over the capacitances existing in conventional integrated circuits. It will be readily appreciated that such an increase in capacitance results in a substantial improvement in the stabilization of the circuit voltage. In some cases, it is only because of this increased capacitance that such a voltage stabilization is even possible.

The arrangements according to the exemplary embodiments can, of course, be varied with respect to their details. The circuit itself, the manner in which the individual semiconductor devices are connected to each other and the type of doping of the semiconductor zones are thus not of critical importance. The significant fact is that, due to the increased capacitance of a barrier layer in integrated semiconductor circuits, the capacitance formed by the barrier layer can be considered as a circuit component and can be utilized to stabilize the voltage.

It will be readily appreciated that substantially any integrated circuit having isolated semiconductor regions can be modified according to the invention to have a substantially increased barrier layer capacitance, and this improvement can occur regardless of the basic shapes of the isolated regions or the doping of the various semiconductor regions of the particular circuit.

It will be understood that the above description of the present invention is susceptible to various modifications, changes and adaptations, and the same are intended to be comprehended within the meaning and range of equivalents of the appended claims.

I claim:

1. In an integrated semiconductor circuit having a substrate of one conductivity type and a plurality of regions of the opposite conductivity type formed in the substrate surface whereby said regions are isolated by the PN-junctions formed between regions and the substrate, and circuit components formed in said isolated regions, the improvement comprising:

a plurality of isolated zones of said one conductivity type disposed in the portions not occupied by said circuit components of at least one of said regions, said isolated zones extending from said substrate surface entirely through said region so as to communicate with the portion of said substrate which underlies said region whereby the capacitance of the PN-junction between the respective region and the substrate is increased.

2. An integrated semiconductor circuit arrangement as defined in claim 1 wherein each said isolated zone has a circular cross section.

3. An integrated semiconductor surface as defined in claim 1 wherein the circuit component formed in the one of said regions containing said isolated zones is a resistor.

4. In an integrated semiconductor circuit having a substrate of one conductivity type and a plurality of regions of the opposite conductivity type formed in the substrate surface whereby said regions are isolated by the PN-junctions formed between the regions and the substrate, and circuit components formed in said isolated regions, the improvement comprising: a heavily doped layer of said opposite conductivity type buried in said substrate beneath one of said regions and extending parallel to said substrate surface, said buried layer joining the overlying one of said regions and having a surface area which, in a plane parallel to said substrate surface, is substantially greater than the cross-sectional area of said overlying region at the interface where said overlying region joins said buried layer, said one of said regions being centered on said buried layer and having a surface area at said substrate surface which is substantially equal to the surface area of said buried layer and greater than the cross-sectional area of said region at said interface, whereby the capacitance of the respective isolating PN-junction is increased.

* * * * *